(12) United States Patent
Primrose (10) Patent No.: US 6,563,905 B1
(45) Date of Patent: May 13, 2003

(54) BALL GRID ARRAY X-RAY ORIENTATION MARK

(75) Inventor: Paul W. Primrose, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 10/016,288

(22) Filed: Oct. 30, 2001

(51) Int. Cl.[7] ............................................. G01N 23/083
(52) U.S. Cl. ........................................... 378/58; 378/22
(58) Field of Search ............................. 378/58, 62, 22, 378/901

(56) References Cited

U.S. PATENT DOCUMENTS 4,926,452 A * 5/1990 Baker et al. .................. 378/22
5,465,152 A * 11/1995 Bilodeau et al. ............. 356/602
6,272,204 B1 * 8/2001 Amtower et al. .............. 378/63
6,404,206 B1 * 6/2002 Sperschneider ............. 324/537

\* cited by examiner

*Primary Examiner*—David V. Bruce
(74) *Attorney, Agent, or Firm*—Philip R. Wadsworth; Charles D. Brown; Howard H. Seo (57) ABSTRACT

An apparatus and method for inspecting electronic component orientation along with x-ray verification of connection integrity is presented. An comprises providing an electronic component 100 for surface mount integration and providing an x-ray visible orientation indicator 300, 402, 500, 600 for the electronic component 100 such that proper orientation of the electronic component 100 is verifiable by x-ray inspection after performing surface mount integration of the electronic component. The x-ray inspection also makes connection integrity of the electronic component 100 verifiable.

16 Claims, 7 Drawing Sheets

BALL GRID ARRAY X-RAY ORIENTATION MARK

BACKGROUND OF THE INVENTION

1. Field of the Invention

The present invention relates to systems and methods for inspecting integrated electronic components, and particularly for inspecting ball grid array (BGA) connected components.

2. Description of the Related Art

Electronic circuit packaging technology presents an important aspect of circuit design. Improved methods of packaging offer improvements in circuit performance as well as cost and time savings. Since its development in the 1960's surface mount technologies, in which electronic components are soldered directly to metal pads on the surface of a printed circuit board, have supplanted conventional "through-hole" packaging methods. Such technologies afford better circuit performance and a higher connection density. Some of the currently available surface mount technologies are the plastic-leaded chip carrier, the small-outline integrated circuit, chip capacitor, chip resistor, ball grid array, and chip scale package.

As with any packaging technology, efficient methods and systems for the inspection and verification of the component connection quality are important to implementing surface mount technologies. X-ray inspection is sometimes used to verify component connections, particularly those where some of the connections are obscured for an ordinary visual inspection.

Ball grid array technology generally employs a dense grid of discrete solder balls to facilitate electrical connection of an electronic component (such as a application specific integrated circuit (ASIC)) and a printed circuit board (PCB). With precision alignment and heating, connection is made between an array of solder pads on the component and another corresponding array of solder pads on the printed circuit via the melted solder balls. The advantages of BGA packaging include reduced component size, cost, and weight, higher I/O count for a given substrate area, improved electrical performance and an easy extension to multi-chip modules. Because the grid presents obscured connections, X-ray inspection is commonly used to verify the integrity of BGA connections.

Furthermore, many component designs employing surface mount technology, and particularly BGA technology, have symmetrical connection patterns of solder pad larrays. These symmetrical connection patterns are preferred (in fact, standard) because they provide a dense arrangement of connections and convenient processing. A dense pattern of connection is a principle motivation for surface mount technologies, including BGA technology. Proper orientation of the component with symmetric connection patterns is conventionally determined by a visual indicator when the component is integrated with the printed circuit board. However, improper orientation of the component still occurs.

Visual orientation indicators are typically silk screened onto the exterior of the component, invisible to an x-ray inspection. In some cases physical features built into the housing material of the electronic component are also used as markers to indicate proper orientation of the electronic component. However, the housing material is always invisible to x-rays; an x-ray visible housing material would prevent any x-ray inspection of the electronic component integration. Thus, connection integrity inspection and orientation verification are currently performed as two separate processes.

There is a need for more efficient systems and methods of inspection for electronic circuit packaging. There is a need for additional inspection checks with a minimum of additional equipment and procedures. There is particularly a need for such improved systems and methods for inspecting component orientation of BGA packaging. There is further a need for such systems and methods without sacrificing the benefits of symmetrical connection patterns. The present invention meets these needs.

SUMMARY OF THE INVENTION

The present invention discloses a method and apparatus providing inspection of the orientation of an electronic component integration where x-ray inspection is employed to verify the connection integrity of the electronic component after integration. Thus, the invention is particularly useful for surface mount technologies, such as a ball grid array (BGA) integration. The present invention can be incorporated into existing integration inspection processes requiring a minimum of additional time and equipment.

An exemplary method of producing inspectable electronic components using the invention comprises providing an electronic component for integration and providing an x-ray visible orientation indicator for the electronic component such that proper orientation of the electronic component is verifiable by x-ray inspection after integration of the electronic component. The x-ray inspection also makes connection integrity of the electronic component verifiable after integration of the electronic component.

An exemplary method of inspecting electronic components using the invention comprises producing an x-ray of an electronic component after the electronic component is integrated, wherein the electronic component includes an x-ray visible orientation indicator and performing x-ray inspection of the x-ray to verify connection integrity of the electronic component and to verify proper orientation of the electronic component.

An exemplary apparatus using the invention, comprises an electronic component for integration and an x-ray visible orientation indicator for the electronic component such that proper orientation of the electronic component is verifiable by x-ray inspection after integration of the electronic component. The x-ray inspection also makes connection integrity of the electronic component verifiable after integration of the electronic component.

The invention can be used with any x-ray inspected integration technology, such as surface mount technologies like ball grid array integration. The invention is useful where the electronic component includes a symmetrical arrangement of solder pads and/or solder balls.

In one embodiment, an x-ray visible orientation indicator has metal content. The x-ray visible orientation indicator can be produced as part of a manufacturing process of the electronic component. For example, the x-ray visible orientation indicator can be produced as part of fabricating a die for the electronic component (e.g. the orientation indicator is fabricated in the die), silk screening markings on the electronic component (e.g. one mark being the orientation indicator), or producing solder pads for the electronic component (e.g. a unique solder pad being the orientation indicator).

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention creates a synergy between connection integrity inspection and orientation verification for component integration. The invention is applicable to any electronic component (e.g. integrated circuit) which is integrated into a larger circuit and reveals a symmetric connection pattern under x-ray inspection. Automated or manual x-ray inspection is used to verify connection integrity for integrated electronic components. However, if the connection pattern of the electronic component is symmetric, scrutiny of the captured x-ray will often reveal no indication whether the component is improperly oriented. This is because the x-ray visible connection pattern is typically symmetrical.

Figure 1A:
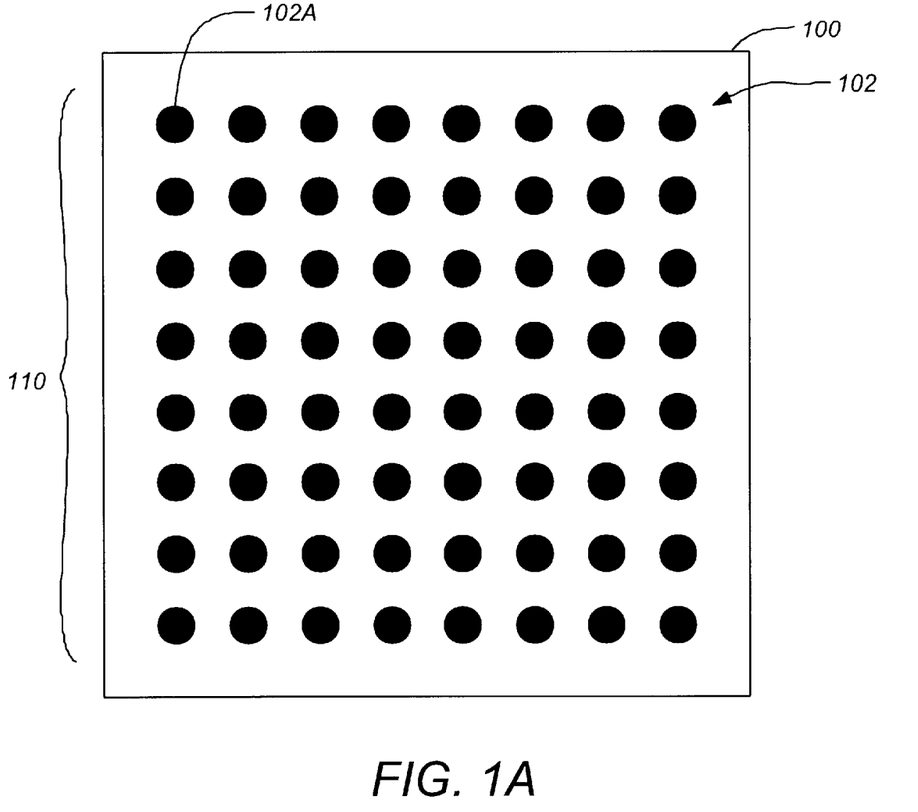
FIGS. 1A and 1B illustrate a typical BGA connection x-ray.
Figure 1B:
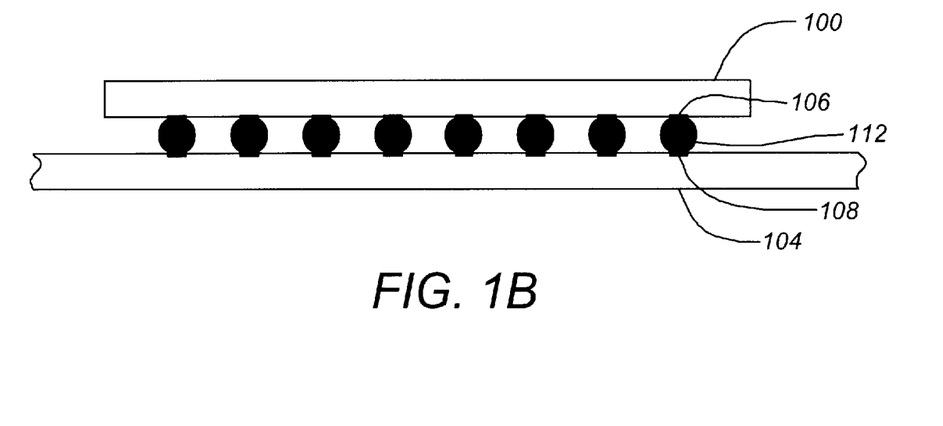

FIGS. 1A and 1B illustrate a typical ball grid array x-ray of an electronic component 100. The symmetric connection pattern 110 is composed of a grid of solder ball connections 102. Each connection 102 is made between a first solder pad 106 on the electronic component 100 and a second solder pad 108 on the printed circuit board 104. An X-ray inspection is used to verify the connection integrity of the solder balls 112 to the solder pads 106, 108. By convention a particular connection 102A is designated as "pin 1" for both the component 100 and the printed circuit board 104. Proper orientation of the electronic component 100 is verified by matching the "pin 1" connection 102A between the two elements. As previously described, however, conventional indicators are invisible to x-ray inspection. Of course, the invention is not limited to providing an orientation indicator directed at "pin 1"; any connection 102 or location within the component 100 can serve as an orientation indicator as described in the example embodiments hereafter.

Figure 2:
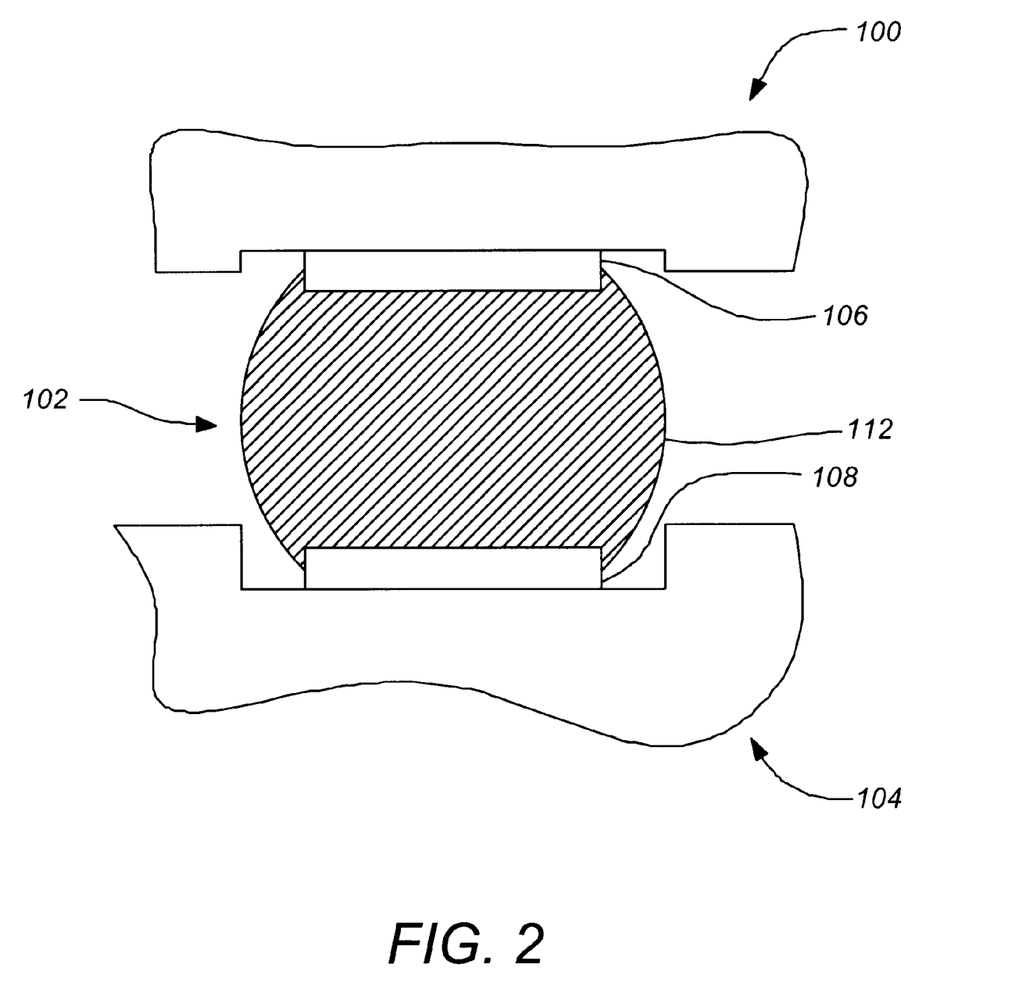
FIG. 2 illustrates a close-up view of an exemplary BGA connection.

FIG. 2 illustrates a close-up view of an exemplary BGA connection 102. The solder ball 112 forms the connection between a first solder pad 106 on the electronic component 100 and a second solder pad 108 on the printed circuit board 104. The connections can be formed beginning with the solder balls 112 adhered to the first solder pads 106 of the electrical component 100 and then precision melted to the second solder pads 108 of the board 104.

Furthermore, although the symmetric connection pattern 110 is shown in the form of a grid having four possible orientations, other symmetric patterns are also used. A symmetric pattern 110 need only have at least two possible orientations which are indistinguishable when the integrated electronic component 100 is x-ray inspected. In other embodiments, the symmetric connection pattern is formed from a grid with one or more omitted rows and/or columns or omitted portions of rows and/or columns (not shown).

The present invention can also be efficiently incorporated into any existing automated x-ray inspection process, such as one that performs computerized image recognition to verify connection integrity. Identifying the position of an orientation indicator can easily be supplemented to the more complex image recognition required to verify connection integrity.

In addition, although the invention is principally described herein with respect to x-ray inspection of a BGA integrated electronic component 100, the invention can be incorporated into any x-ray inspection process for a component 100. The invention is not limited to BGA integration or even surface mount technologies.

Example Embodiments

In one embodiment of the present invention, an x-ray visible indicator is provided on the electronic component. Although not required, the indicator will have metal content, thereby providing a more distinct mark in an x-ray. A number of different techniques can be used to produce the indicator, however, it is preferable that the indicator is produced as part of the ordinary manufacturing processes of the electronic component, thus minimizing the cost of implementation. It is also preferable that the indicator does not obscure the elements which are to be x-ray inspected.

Some examples of ordinary manufacturing processes of an electronic component which can be altered to implement the present invention are detailed in the following paragraphs. They include printing identification marks, die fabrication, and manufacturing and positioning solder pads and electrical contacts.

Figure 3:
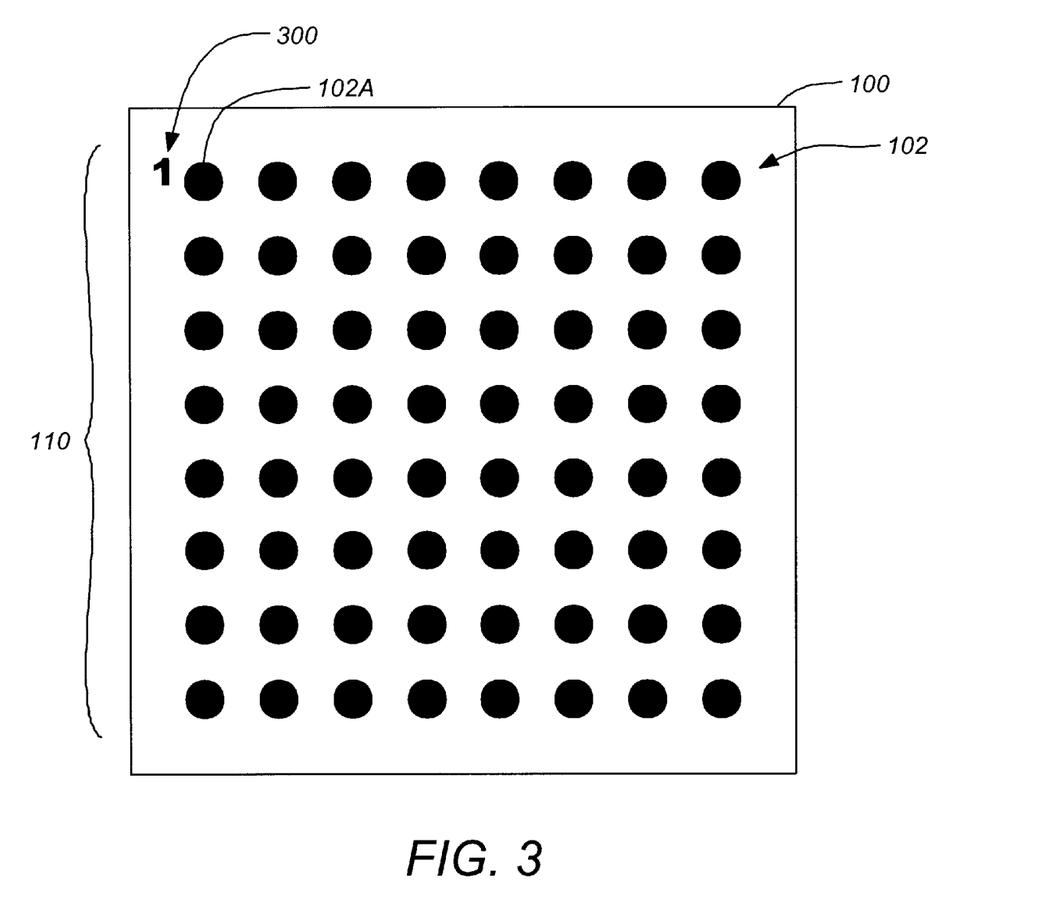
FIG. 3 illustrates an exemplary BGA connection x-ray with an x-ray visible orientation indicator.

FIG. 3 illustrates an exemplary BGA connection x-ray showing an x-ray visible orientation indicator 300. Markings are printed on the exterior of electronic components 100 as part of ordinary manufacturing processing for the purposes identification. For example, electronic components 100 can be marked using a silk screen process. In this embodiment, the orientation indicator 300 is a silk screened x-ray visible "1" mark indicating the "pin 1" connection 102A. To enhance x-ray visibility of the mark, metal content can be included in the silk screened material. For example, the silk screened ink can be loaded with metal powder. Other printing processes, such as stamping or manual writing, can also be used provided an x-ray visible mark is produce. In addition, the mark itself may take any form or shape, although "1" obtains recognition in the industry.

Figure 4:
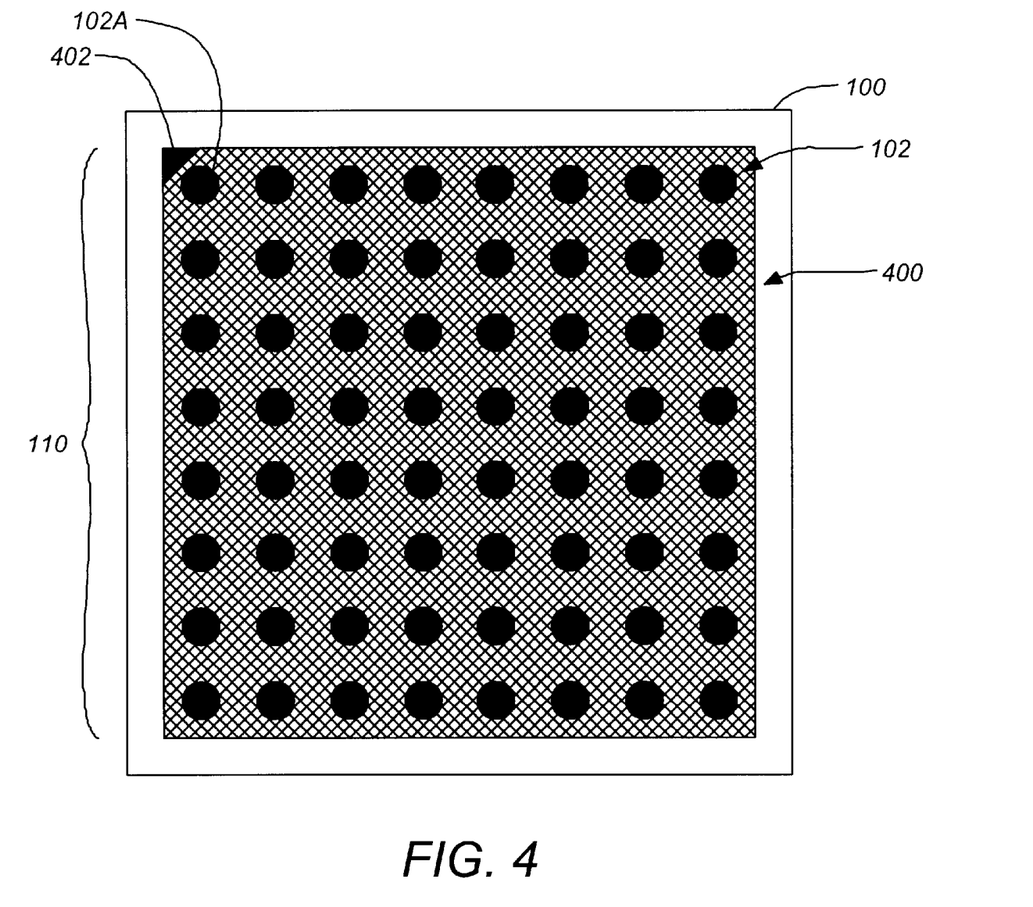
FIG. 4 illustrates an exemplary BGA connection x-ray with an x-ray visible orientation indicator in the die.

FIG. 4 illustrates an exemplary BGA connection x-ray with an x-ray visible orientation indicator in the die 400 of the electronic circuit of the component 100. Electronic component manufacturing typically employs fabricating a die 400 of the electronic circuit of the component 100 and includes forming the electrical connections with the solder pads 106. In one embodiment, an x-ray visible orientation indicator 402 is fabricated within the die 400 in an innocuous region that will not obscure the x-ray inspection of the BGA connections. The orientation indicator 402 can be any shape, as long as it can be used to verify proper orientation of the electronic component 100. In one embodiment, one corner of the die 400 is distinctly marked with metal as the orientation indicator 402. The orientation indicator 402 will be x-ray visible because the die 400 includes metal constituents.

Figure 5:
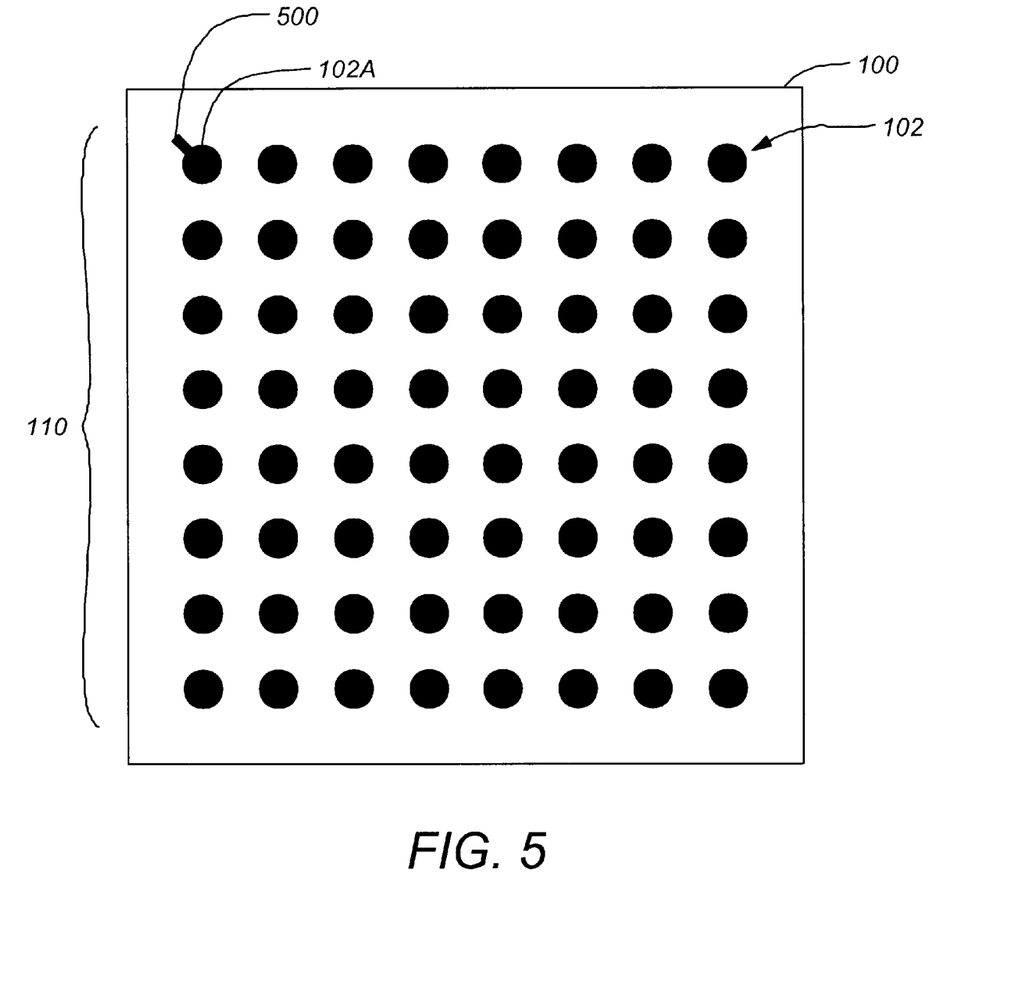
FIG. 5 illustrates an exemplary BGA connection x-ray with an x-ray visible orientation indicator solder pad.

FIG. 5 illustrates an exemplary BGA connection x-ray with an x-ray visible orientation indicator 500 included in the solder pad 102A. In this embodiment of the invention, the orientation indicator 500 is a distinctly shaped contact pad 500 at the "pin 1" connection 102A. The shape of the distinct contact pad 500 can be any form that will allow it to be distinguished from the other contact pads 102. However, the shape should be such that there is negligible negative impact to the electrical performance of the component 100 and such that it does not obstruct x-ray inspection of the electrical connection.

Figure 6:
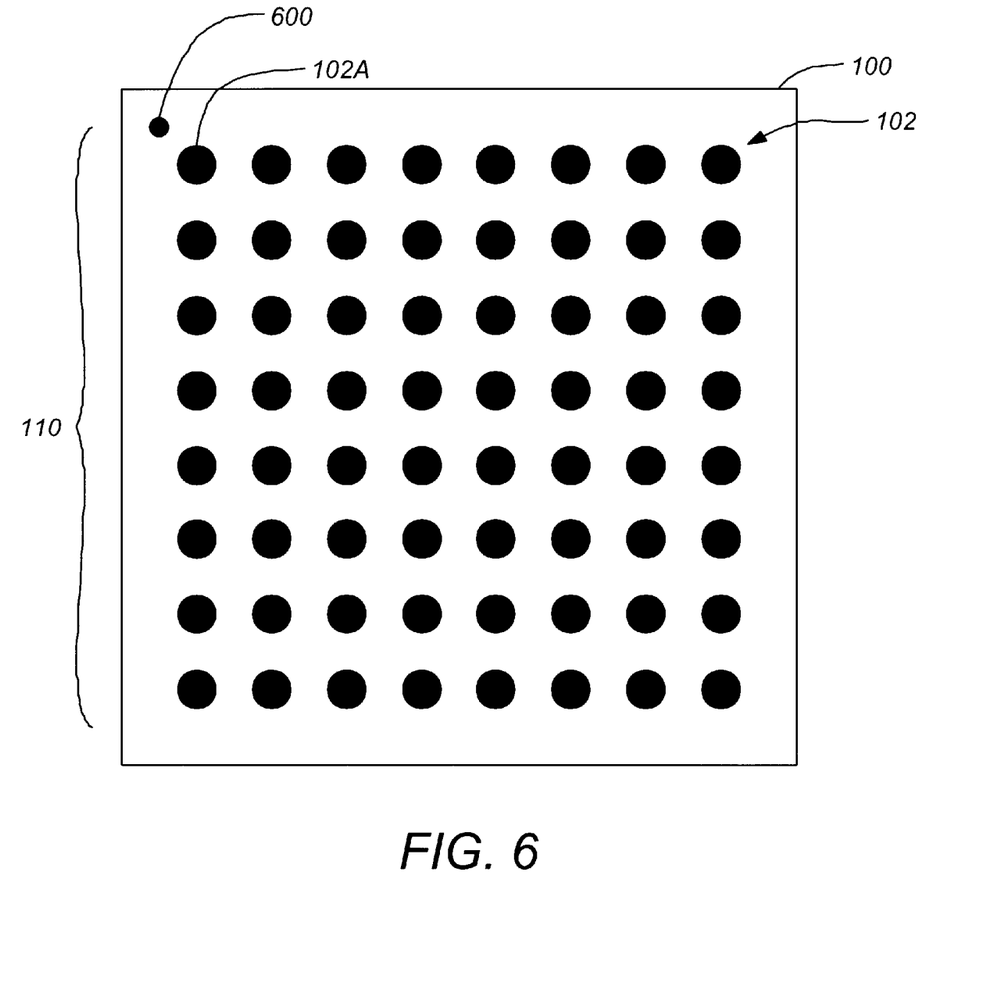
FIG. 6 illustrates an exemplary BGA connection x-ray with a separate x-ray visible orientation indicator.

FIG. 6 illustrates an exemplary BGA connection x-ray with a separate x-ray visible orientation indicator. In yet another embodiment of the invention, the x-ray visible orientation indicator 600 is a separate element within the component material. The indicator 600 can be added separately from the ordinary manufacturing processes. Alternately, the separate indicator 600 can be an additional non-functional solder pad (without an electrical connector or solder ball), conveniently installed along with the functional solder pads. Using an extra solder pad as the orientation indicator 600 eliminates the need for a separately manufactured part.

Example Method Embodiments

Figure 7:
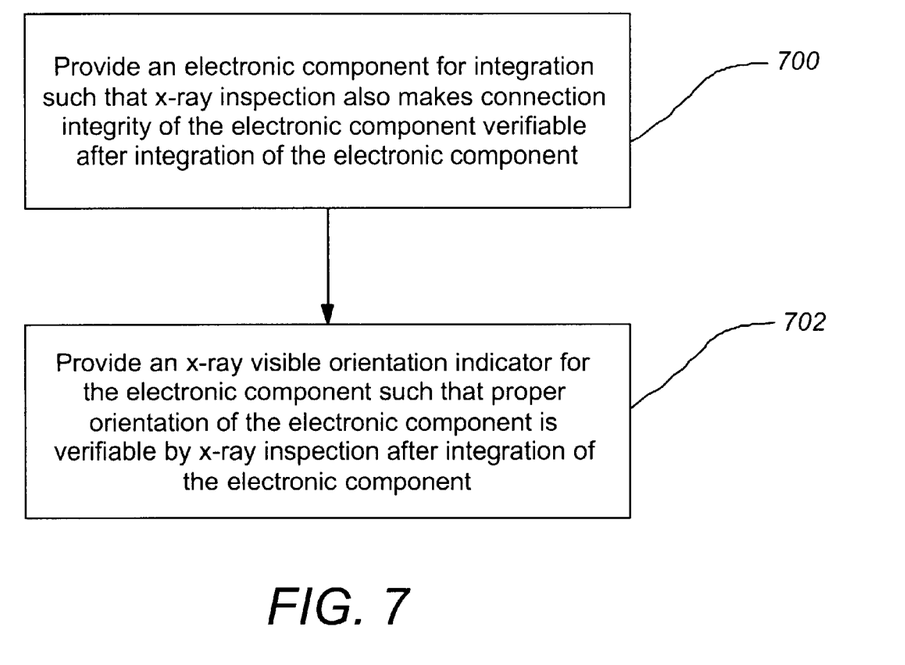
FIG. 7 is a flowchart of a method of producing inspectable electronic components using the invention.

FIG. 7 is a flowchart of a method of producing inspectable electronic components using the invention. The process begins by providing an electronic component for integration at block 700. Next, an x-ray visible orientation indicator for the electronic component is provided such that proper orientation of the electronic component is verifiable by x-ray inspection after integration of the electronic component at block 702. The orientation indicator can be provided as part of a number of ordinary electronic component manufacturing processes, such as printing identification marks, die fabrication, and manufacturing and positioning solder pads. The x-ray inspection also makes connection integrity of the electronic component verifiable after integration of the electronic component.

Figure 8:
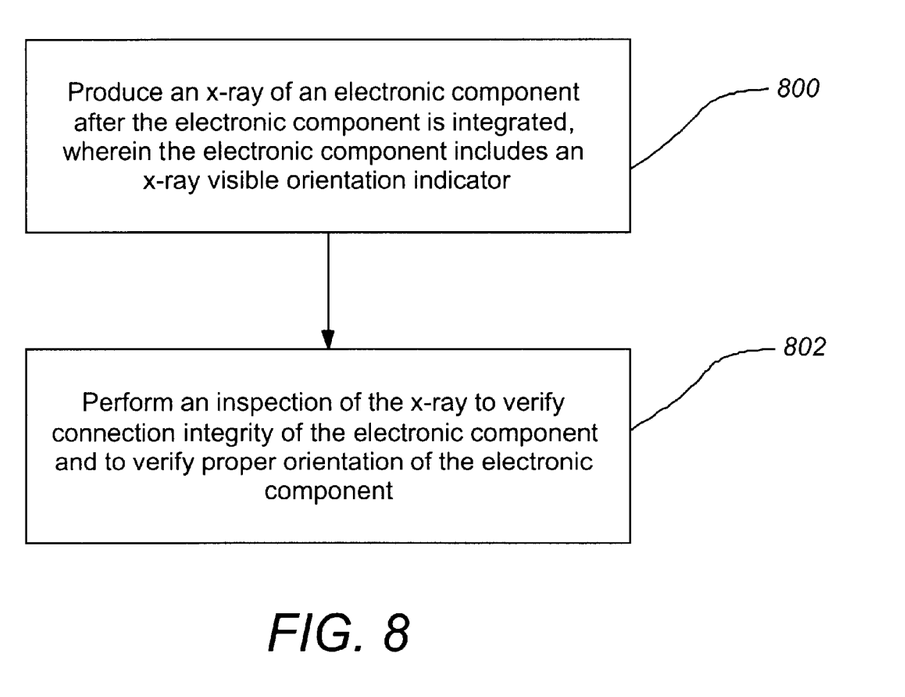
FIG. 8 is a flowchart of a method of inspecting electronic components using the invention.

FIG. 8 is a flowchart of a method of inspecting electronic components using the invention. The process begins by producing an x-ray of an electronic component after the electronic component is integrated at block 800. The electronic component includes an x-ray visible orientation indicator. The orientation indicator can be provided as part of a number of ordinary electronic component manufacturing processes, such as printing identification marks, die fabrication, and manufacturing and positioning solder pads. Next, the inspection of the x-ray to verify connection integrity of the electronic component and to verify proper orientation of the electronic component is performed at block 802.

CONCLUSION

This concludes the description including the preferred embodiments of the present invention. The foregoing description including the preferred embodiment of the invention has been presented for the purposes of illustration and description. It is not intended to be exhaustive or to limit the invention to the precise form disclosed. Many equivalent modifications and variations are possible in light of the above teaching.

It is intended that the scope of the invention be limited not by this detailed description, but rather by the claims appended hereto. The above specification, examples and information provide a complete description of the manufacture and use of the apparatus and method of the invention. Since many embodiments of the invention can be made without departing from the scope of the invention, the invention resides in the claims hereinafter appended.

What is claimed is:

1. A method of producing inspectable electronic components, comprising the steps of:
   providing an electronic component for integration; and
   providing an x-ray visible orientation indicator for the electronic component such that proper orientation of the electronic component is verifiable by x-ray inspection after the integration of the electronic component;
   wherein the x-ray inspection also makes connection integrity of the electronic component verifiable after the integration of the electronic component.

2. The method of claim 1, wherein the integration is a ball grid array integration.

3. The method of claim 1, wherein the electronic component includes a symmetrical arrangement of solder pads.

4. The method of claim 1, wherein the x-ray visible orientation indicator has metal content.

5. The method of claim 1, wherein the x-ray visible orientation indicator is produced as part of a manufacturing process of the electronic component.

6. The method of claim 5, wherein the manufacturing process is fabricating a die for the electronic component.

7. The method of claim 5, wherein the manufacturing process is silk screening markings on the electronic component.

8. The method of claim 5, wherein the manufacturing process is producing solder pads for the electronic component.

9. A method of inspecting electronic components, comprising the steps of:
   producing an x-ray of an electronic component after the electronic component is integrated, wherein the electronic component includes an x-ray visible orientation indicator; and
   performing x-ray inspection of the x-ray to verify connection integrity of the electronic component and to verify proper orientation of the electronic component.

10. The method of claim 9, wherein the electronic component is integrated with ball grid array integration.

11. The method of claim 9, wherein the electronic component includes a symmetrical arrangement of solder pads.

12. The method of claim 9, wherein x-ray visible orientation indicator has metal content.

13. The method of claim 9, wherein the x-ray visible orientation indicator is produced as part of a manufacturing process of the electronic component.

14. The method of claim 13, wherein the manufacturing process is fabricating a die for the electronic component.

15. The method of claim 13, wherein the manufacturing process is silk screening markings on the electronic component.

16. The method of claim 13, wherein the manufacturing process is producing solder pads for the electronic component.

* * * * *